(12) United States Patent
Sjoland et al.

(10) Patent No.: US 10,498,343 B2
(45) Date of Patent: Dec. 3, 2019

(54) PHASE LOCKED LOOP, PHASE LOCKED LOOP ARRANGEMENT, TRANSMITTER AND RECEIVER AND METHOD FOR PROVIDING AN OSCILLATOR SIGNAL

(71) Applicant: Telefonaktiebolaget LM Ericsson (publ), Stockholm (SE)

(72) Inventors: Henrik Sjoland, Lund (SE); Tony Pahlsson, Lund (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 16/091,090

(22) PCT Filed: Apr. 8, 2016

(86) PCT No.: PCT/EP2016/057720
§ 371 (c)(1),
(2) Date: Oct. 3, 2018

(87) PCT Pub. No.: WO2017/174142
PCT Pub. Date: Oct. 12, 2017

(65) Prior Publication Data
US 2019/0131978 A1    May 2, 2019

(51) Int. Cl.
*H03L 7/07* (2006.01)
*H03L 7/085* (2006.01)
(Continued)

(52) U.S. Cl.
CPC ............... *H03L 7/07* (2013.01); *H03L 7/085* (2013.01); *H03L 7/087* (2013.01); *H03L 7/0891* (2013.01);
(Continued)

(58) Field of Classification Search
CPC ......... H03L 7/07; H03L 7/087; H03L 7/0891; H03L 7/093; H03L 7/0992; H04L 5/0048; H04L 7/0331
See application file for complete search history.

(56) References Cited

U.S. PATENT DOCUMENTS 7,577,225 B2 * 8/2009 Azadet ................... H03L 7/087
327/147
7,888,973 B1   2/2011 Rezzi et al.
(Continued)

OTHER PUBLICATIONS

PCT International Search Report, dated Dec. 6, 2016, in connection with International Application No. PCT/EP2016/057720, all pages.
(Continued)

*Primary Examiner* — Freshteh N Aghdam
(74) *Attorney, Agent, or Firm* — Leffler Intellectual Property Law, PLLC

(57) ABSTRACT

A phase locked loop, for a particularly in a beamforming system comprises a digital loop filter to provide a digital control word to a controllable oscillator; a frequency divider configured to provide a first feedback signal and a second feedback signal in response to an oscillator signal, the second feedback signal delayed with respect to the first feedback signal; a first comparator path configured to receive the first feedback signal and a second comparator path configured to receive the second feedback signal, each of the first and second comparator path configured to provide a respective phase delay signal to the digital loop filter in response to a respective adjustment signal and a phase deviation between a common reference signal and the respective feedback signal.

19 Claims, 9 Drawing Sheets

(51) Int. Cl.
   *H03L 7/087* (2006.01)
   *H03L 7/089* (2006.01)
   *H03L 7/093* (2006.01)
   *H03L 7/099* (2006.01)
   *H04L 5/00* (2006.01)
   *H04L 7/033* (2006.01)

(52) U.S. Cl.
   CPC ............ *H03L 7/093* (2013.01); *H03L 7/0992* (2013.01); *H04L 5/0048* (2013.01); *H04L 7/0331* (2013.01)

(56) References Cited

U.S. PATENT DOCUMENTS

| | | | |
|---|---|---|---|
| 8,373,469 B2* | 2/2013 | Kim | H03L 7/081 327/148 |
| 8,531,219 B1* | 9/2013 | Dunworth | H03L 7/08 327/147 |
| 10,205,460 B2* | 2/2019 | Guo | H03L 7/1976 |
| 2002/0070811 A1* | 6/2002 | Skierszkan | H03L 7/07 331/1 A |
| 2007/0071156 A1 | 3/2007 | Gregorius et al. | |
| 2008/0265999 A1 | 10/2008 | Wan et al. | |
| 2008/0297414 A1* | 12/2008 | Krishnaswamy | H01Q 3/28 342/368 |
| 2010/0329388 A1* | 12/2010 | Ko | H03L 7/081 375/300 |

OTHER PUBLICATIONS

PCT Written Opinion, dated Dec. 6, 2016, in connection with International Application No. PCT/EP2016/057720, all pages.

Bo Shi et al., Electronic Beam Steering Using PLL Array for Radar Applications in W-band, 2015 IEEE Asia-Pacific Conference on Synthetic Aperture Radar (APSAR), Sep. 1, 2015, pp. 274-276.

N.B. Buchanan et al., Triple Mode PLL Antenna Array, Microwave Symposium Digest, 2004 IEEE MTT-S International, Fort Worth, TX, USA, Jun. 6-11, 2004, Piscataway, NJ, USA, vol. 3, pp. 1691-1694.

Andreas Axholt et al., A PLL Based 12 GHz LO Generator with Digital Phase Control in 90nm CMOS, IEEE Asia-Pacific Microwave Conference 2009, Singapore, Dec. 7-10, 2009, 12 pages.

Andreas Axholt et al., A 60 GHz Receiver Front-End with PLL based Phase Controlled LO Generation for Phased-Arrays, IEEE Asia Pacific Microwave Conference, APMC 2011, Dec. 2011, Melbourne, Australia, 6 pages.

* cited by examiner

PHASE LOCKED LOOP, PHASE LOCKED LOOP ARRANGEMENT, TRANSMITTER AND RECEIVER AND METHOD FOR PROVIDING AN OSCILLATOR SIGNAL

TECHNICAL FIELD

The present disclosure relates to a phase locked loop, particularly for a beamforming system, a phase locked loop arrangement, a transmitter and receiver arrangement and a method for providing an oscillator signal in a phase locked loop

BACKGROUND

Wireless systems typically up-convert a baseband signal to a Radio Frequency (RF) for transmission, and down-convert received RF signals to baseband for processing. Such frequency conversion requires producing a reliable mixing frequency signal, typically referred to as a local oscillator (LO) signal, for use in the RF front-end of a wireless device. Phase-Locked Loops (PLLs) are often used to provide such mixing frequency signals. In some cases, stringent requirements are placed on the mixing frequency signal, such as produced by a PLL.

It is foreseeable that 5G cellular systems will use millimetre waves, where the frequencies currently in discussion range between 15 GHz and 60 GHz. In order to use such 5G system outdoors, a longer cyclic prefix has to be used compared to newly released 60 GHz indoor systems. Such longer cyclic prefixes necessitate a closer sub-carrier spacing in the OFDM modulation. This closer sub-carrier spacing poses stringent phase noise requirements on the output of the PLLs. At the same time, beamforming should be supported to increase the range and capacity of the system, which results in a large number of antenna elements. The signal at each antenna element of a beamforming system will have an individual phase shift that controls the beam and in particular the beam direction. In some implementations, the beam controlling phase shifts are imposed on the oscillator signal generated by the PLL. In any event, accurate phase shifts are required to provide accurate beamforming. It is also desirable to be able to program the frequency of the oscillator signal to enable the wireless device to operate on different frequency channels and in different bands.

Besides the ability to introduce a programmable phase shift and programmable frequency, the local oscillator generation circuitry shall also achieve a low phase noise and other aspects without consuming excessive power.

SUMMARY

As a result of all of these considerations, the inventors have realized that it would be beneficial to improve the generation of the oscillator signals so as to provide the desired phase shift programmability.

The solution presented herein proposes to adjust or change the phase of an oscillator signal by comparing the reference signal with different feedback signals and generate an oscillator control signal depending therefrom and from a phase adjustment signal.

According to an aspect, a phase locked loop for or in a beamforming system comprises a digital loop filter configured to provide a digital control word to a digital controlled oscillator, wherein the digital controlled oscillator is configured to provide an oscillator signal in response to the digital control word. A frequency divider is configured to provide a first feedback signal and a second feedback signal in response to the oscillator signal. The second feedback signal is delayed with respect to the first feedback signal. Further, a first comparator path is configured to receive the first feedback signal and a second comparator path is configured to receive the second feedback signal. Each of the first and second comparator paths is configured to provide a phase delay signal to the digital loop filter in response to a phase deviation between a common reference signal and the respective feedback signal and a respective phase adjustment signal. Said adjustment signal may be used to control the phase of the oscillator signal.

The proposed solution offers an easier matching of the circuitry providing the phase delay signals thus enabling improved phase control accuracy. The area used to implement the hardware may be reduced compared to previous solutions. In addition, the relation between the phase skew and the phase adjustment signals applied to the comparator paths may become substantially linear in the phase region of interest.

According to another aspect, phase locked loop arrangement for a beamforming system having at least two phase locked loops as disclosed above also comprises a reference signal source providing the reference signal. The reference signal source is coupled to the first and second comparator path of each of the at least two phase locked loops. A phase deviation module is configured to provide a phase control signal or phase control word to each of the phase locked loops to generate a phase difference between oscillator signals of the at least two phase locked loops. In this aspect, a phase difference between two or more phase locked loops in or for a beamforming system can be easily adjusted by the phase control signals applied to the phase locked loops from which the adjustment signals are derivable. In an aspect the phase locked loop utilizes the phase control signal or phase control word to generate the phase adjustment signals.

Other aspects are related to a transmitter and a receiver respectively. A transmitter comprises phase locked loop arrangement or a plurality of the phase locked loops as stated above and an antenna array having a plurality of antenna elements. Each of the antenna elements is in operative connection to a respective one of the phase locked loops to receive an individual signal for transmission derived from the respective oscillator signal thereof.

Concurrently, a receiver comprises a phase locked loop arrangement or a plurality of the phase locked loops as stated above and an antenna array having a plurality of antenna elements. Each of the antenna elements is in operative connection to a respective one of the phase locked loops of the phase locked loop arrangement to down-convert a received signal with the respective oscillator signal thereof.

Yet another aspect is related to method for providing an oscillator signal in a phase locked loop. The method comprises generating a common reference signal, generating an oscillator signal in response to a digital control word, generating a first feedback signal based on the oscillator signal and a second feedback signal based on the oscillator signal. The second feedback signal is delayed with respect to the first feedback signal. The method also comprises generating a first phase delay signal based on a comparison between the reference signal and the first feedback signal and a second phase delay signal based on a comparison between the reference signal and the second feedback signal. A ratio between the first and second phase delay signals is adjusted. Finally, the digital control word is generated based on the adjusted ratio of first and second phase delay signals.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1A:
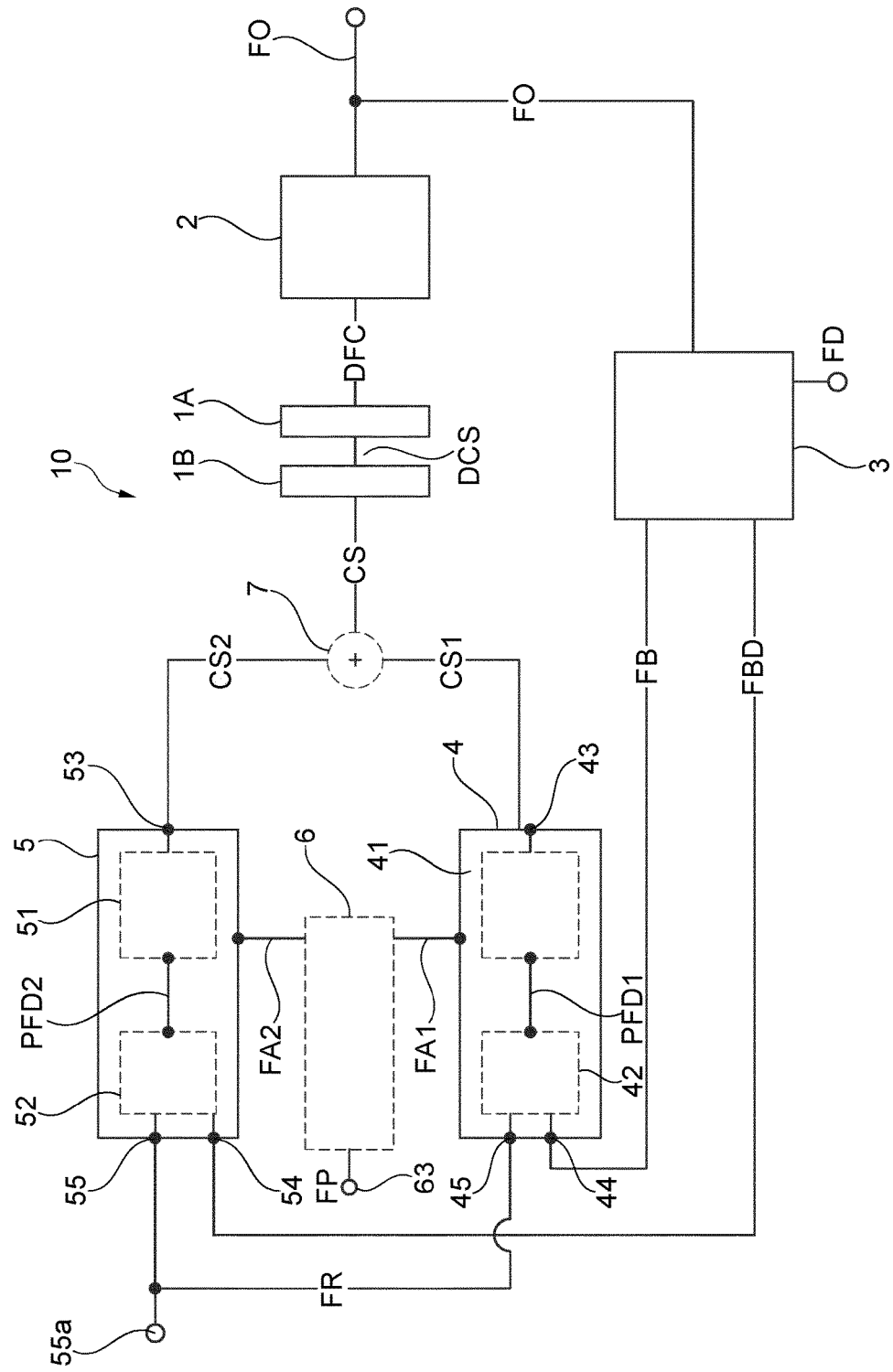
FIG. 1A illustrates an embodiment of a phase locked loop with a digital controlled oscillator.

Aspects of the present disclosure will be described more fully hereinafter with reference to the accompanying drawings. The apparatus and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

It should further be noted that any reference signs do not limit the scope of the claims, that the example embodiments may be implemented at least in part by means of both hardware and software, and that several "means", "units" or "devices" may be represented by the same item of hardware.

A "wireless device" as the term may be used herein, is to be broadly interpreted to include a radiotelephone having ability for Internet/intranet access, web browser, organizer, calendar, a camera (e.g., video and/or still image camera), a sound recorder (e.g., a microphone), and/or global positioning system (GPS) receiver; a personal communications system (PCS) user equipment that may combine a cellular radiotelephone with data processing; a personal digital assistant (PDA) that can include a radiotelephone or wireless communication system; a laptop; a camera (e.g., video and/or still image camera) having communication ability; and any other computation or communication device capable of transceiving, such as a personal computer, a home entertainment system, a television, etc. Furthermore, a device may be interpreted as any number of antennas or antenna elements.

Although the description is mainly given for a user equipment, as measuring or recording unit, it should be understood by the skilled in the art that "user equipment" is a non-limiting term which means any wireless device, terminal, or node capable of receiving in DL and transmitting in UL (e.g. PDA, laptop, mobile, sensor, fixed relay, mobile relay or even a radio base station, e.g. femto base station).

It is foreseeable that the next generation of cellular systems and wireless communication will use frequencies in the higher GHz frequency range, that is above 15 GHz and up to 60 GHz. Outdoors in rural and urban areas the signal echoes will have longer delays than indoors, so longer prefixes resulting in closer subcarrier-spacing in the proposed underlying OFDM modulation is required compared to indoor only systems. Consequently, phase noise and other requirements concerning the signal quality are increased to achieve a reliable data transmission enabling high data throughput. Furthermore, the signal attenuation at these frequencies will be high in a cellular system, which can be mitigated using beamforming systems. Such beamforming systems include a large number of antenna elements in an array, being able to transmit or receive in a desired and steerable direction. To control the beam direction for receiver and transmitter, a dedicated phase shift of the signal must be applied to each respective antenna element. In a key implementation it has been proposed to establish such phase shift in the local oscillator signal provided by a PLL coupled to the respective antenna element.

In these cases, each antenna element is connected to a transceiver (transmitter and/or receiver, and each transceiver receives individual local oscillator (LO) signals from a local phase-controlled phase locked loop, or short PLL. The phase locked loop comprises a feedback path, normally including a programmable frequency divider circuit dividing the output oscillator signal by a programmable ratio and feeding the frequency-divided signal back to the phase comparator. As a result, the phase comparator using a common reference signal, e.g. a common reference signal in the low frequency range, the output signals of the PLLs will lock in different well defined phase relations. Regardless of scheme used for the frequency division, integer-N or fractional-N, there is a need to control the phase of the output signal of the different PLLs.

Some proposals suggested using digitally controlled current sources to inject current into the loop filters of each local PLL, which will produce a very accurately controlled and linear phase shift of the output signal.

A solution for generating the local oscillator signals with some control for its phase is for example illustrated in A. Axholt, H. Sjöland, "A PLL based 12 GHz LO generator with digital phase control in 90 nm CMOS", Analog Integrated Circuits and Signal Processing, Vol. 67, No. 3, pp. 309-318, 2011. Another example is shown in A. Axholt and H. Sjöland, "A 60 GHz Receiver Front-End with PLL based Phase Controlled LO Generation for Phased-Arrays", IEEE Proc. Asia Pacific Microwave Conference, APMC 2011, APMC 2011, December 2011, Melbourne, Australia. In both cases, an additional adjustable current source injects a small DC current into the loop filters of each local PLL, which produces a phase shift of the output signal. In equilibrium, the loop becomes frequency and phase locked and will strive to return in case of deviations, and the loop reacts to the "disturbance" caused by the injected current by a proportional phase-skew between the reference signal and the feedback signal at the input of the phase detector.

In the examples shown in prior art, a phase-skew of one output cycle-, that is 360° phase at the frequency of the output signal-, between the reference signal and the feedback signal corresponds to a charge-pump charge pulse of $I_{CHP}*(1/f_{osc})$. The current injected by the current source that corresponds to this charge pulse is transferred over (or "smeared out" over) the whole signal period of the reference signal $f_{REF}$. As a result, the ratio between the charge pulse current and the current injected by the current source becomes dependent on the divider ratio N within the feedback path of the phase lock loop:

$$I_{CHP}*(1/f_{OSC})=I_{DC}*(1/f_{REF})$$

$$I_{DC}=I_{CHP}(f_{REF}/f_{OSC})=I_{CHP}/N$$

For a 1-degree phase change, the required injected current becomes $$I_{DC}=I_{CHP}/(N*360) \qquad (1)$$

As the output frequency of the oscillator signal is in the range of 20 GHz, while the reference frequency is about 300 MHz, one can assume under normal circumstances a divider ratio N between 50 and 100. If one assumes a divider ratio of N=70, the injected $I_{DC}$ current change for a 1-degree phase skew becomes about 25000 times smaller than the charge pump current. As the accuracy of current ratios is typically limited by the matching properties, designs of current sources with good matching at such ratios are needed. It is difficult to realize current sources with this enormous ratio while maintaining good matching accuracy, for instance the technique of using unit current sources of equal design would require 25000 units for each current source. Hence, the solutions as stated above will call for a trade-off resulting in either phase control with low accuracy or large chip area. In other words, the current requirement on accuracy of the phase adjustment results in high requirements for current source matching leading to a substantial increase in chip size.

The present solution proposes a different concept, which may have the advantage in reducing the required transistor matching requirements to obtain certain phase accuracy. More particularly, the above and the following solution ratio between the charge pump current or more generally charge pump signal and the phase control current or signal is much smaller than for the previous solutions. The solution also requires less area than conventional solution and may reduce PLL lock-time.

In an aspect a phase locked loop for a beamforming system comprises a digital loop filter configured to provide a digital control word to a digital controlled oscillator, said digital controlled oscillator configured to provide an oscillator signal in response to the digital control word. A frequency divider is configured to provide a first feedback signal and a second feedback signal in response to the oscillator signal. The second feedback signal is delayed with respect to the first feedback signal. A first comparator path is configured to receive the first feedback signal and a second comparator path is configured to receive the second feedback signal. Each of the first and second comparator path are configured to provide a respective phase delay signal to the digital loop filter in response to a respective phase adjustment signal and a phase deviation between a common reference signal and the respective feedback signal.

It is generally proposed to achieve a phase adjustment by interpolating the phase between two signals generated by a frequency divider. This frequency divider is clocked by the output signal of the phase locked loop (PLL), and can thus generate accurate output signals with a resolution of one output cycle. In addition to the regular feedback signal a second feedback signal is generated, which may be a replica of the feedback signal but delayed with respect to it. Interpolation is then performed by two charge pumps, each of them receiving a control signal of a phase comparator coupled thereto. The ratio between the signal magnitudes of the different charge pumps determines their weight in setting the steady state output signal phase.

Despite the advantages stated above, the proposed aspects may consume less chip area, which lead to easier and cheaper manufacturing process. In addition, the proposed phase locked loop provides a linear relationship between a charge pump current and the resulting phase skew. As the oscillator as well as the loop filter is implemented as elements processing their respective inputs digitally, the area consumed by the PLL is further reduced. AM-PM conversion resulting in additional phase noise of the output signal is reduced, because a digitally controlled oscillator avoids the use of continuously tunable capacitors, so called varactors, to adjust its output frequency, in contrast to a VCO counterpart. In this regard the expression "digital controllable" and "digital controlled" shall be considered equal in its function and structure.

In an aspect of the present disclosure each of the first and second comparator paths comprise a phase comparator configured to output a respective control signal in response to the phase deviation; and an adjustable charge pump. The adjustable charge pump is configured to provide the respective phase delay signal to the digital loop filter in response to the control signal and the respective adjustment signal.

In some aspects the adjustable charge pump is implemented as a digital charge pump that it provides a digital phase delay signal or word in response to the control signal by the comparator. In such aspect the signal chain from the digital charge pump to the digital controlled oscillator is fully digital, thereby reducing unintended coupling of spurious signal. In another aspect an analogue-digital converter is provided between the adjustable charge pump and the digital loop filter.

In an aspect, the mentioned delay of the second feedback signal with respect to the first feedback signal is dependent on the frequency or the period of the oscillator signal. For example the delay may be a multiple of the half period of the oscillator signal and in a particular aspect at least one period of the oscillator signal. In an aspect such delay may be adjustable. The proper delay reduces the current matching requirements with respect to previous solution, while it also reduces or prevents non-linearity in the control signal response for the oscillator due to cross-over distortion in the comparator paths.

Another aspect is related to the signal to the digital loop filter, wherein a sum of the respective phase delay signals of the first and second comparator paths is kept substantially constant. In this regard, the phase locked loop may comprise a combiner for summing the respective phase delay signals from each of the comparator paths and to provide a summed phase delay signal to the loop filter. As a result, the phase adjustment of the phase locked loop may become proportional to the phase delay signal of the second comparator path, and particularly to the amplitude of said phase delay signal. A constant sum of signal amplitudes will also provide constant loop dynamics like bandwidth and settling. Hence, the loop behavior becomes less dependent on phase setting.

In other words, a phase of the oscillator signal is substantially controlled by an amplitude of the phase delay signal of the second comparator path or by a portion of the control signal derived from the signal of the second comparator path. In case of a digital phase delay signal or phase delay word, the amplitude corresponds to the summed level of the phase delay signals or phase delay words, respectively.

In yet another aspect, the phase locked loop comprises an adjustment circuit configured to adjust the ratio of amplitudes of the phase delay signals of the respective adjustable charge pumps. This allows setting a reference from which the phase delay signals are derived. In this regard, the adjustment circuit may comprise a phase control input for applying a respective control signal. Such signal can be a digit phase adjustment word. In an aspect, the adjustment circuit is configured to provide respective adjustment signals to the respective adjustable charge pumps. The adjustment circuit enables the phase locked loop to control the phase of the oscillator output signal.

In another aspect, the phase locked loop is part of a phase locked loop arrangement, comprising at least two phase locked loops and a reference signal source. The reference signal source is configured to provide the reference signal and is also coupled to the first and second comparator path of each of the at least two phase locked loops. A phase deviation module is configured to provide a phase control signal to each of the phase locked loops to generate a phase difference between oscillator signals of the at least two phase locked loops.

With the phase locked loop arrangement the phase relationship between one or more PLL output signals can easily be set and/or adjusted. The phase locked loop arrangement can be used for a beamforming system.

In yet an aspect, the phase locked loop arrangement is implemented in a transmitter, a receiver or more generally a transceiver. For example a transmitter of the above kind comprises the phase locked loop arrangement and an antenna array having a plurality of antenna elements. Each of the antenna elements is in operative connection with a respective one of the phase locked loops of the phase locked loop arrangement to receive an individual signal for transmission derived from the respective oscillator signal thereof. Said individual signal can for example be an up-converted signal or a mixed signal using the respective oscillator signal.

Likewise, an exemplary receiver arrangement comprises a phase locked loop arrangement as disclosed above and an antenna array having a plurality of antenna elements, wherein each of the antenna elements is in operative connection to a respective one of the phase locked loops of the phase locked loop arrangement to down-convert a received signal with the respective oscillator signal thereof.

Another aspect refers to a method. In the method for providing an oscillator signal in a phase locked loop, a common reference signal and an oscillator signal is generated in response to a digital control word. First feedback signal based on the oscillator signal and a second feedback signal based on the oscillator signal are generated, wherein the second feedback signal is delayed with respect to the first feedback signal. Based on a comparison between the reference signal and the first feedback signal a first phase delay signal is generated. Likewise a second phase delay signal is generated based on a comparison between the reference signal and the second feedback signal. A ratio between the first and second phase delay signals is adjusted and the control signal based on the adjusted ratio of first and second phase delay signals is generated.

Generating the second feedback signal may comprise delaying the first feedback signal depending on the frequency or period of the oscillator signal. Such delay can be an integer multiple of the half-period of the output signal.

In a further aspect, a sum of the first and the second phase delay signals is kept substantially constant. By keeping the sum constant, the phase will become proportional to the second phase delay signal amplitude. In another aspect, adjusting the ratio comprises adjusting at least one of the amplitudes of the first and second phase delay signals. It may also comprise summing up the amplitudes of the first and second phase delay signals. Further, generating the control signal may comprise combining the first and second phase delay signals and filtering the combined phase delay signals.

FIG. 1A shows an embodiment illustrating one or more aspects of the present disclosure. The phase locked loop 10 is suitable for a beamforming system, in which multiple LO signals having a specific phase shift to each other are generated. The phase locked loop comprises a digital loop filter 1A configured to provide a digital frequency control word DFC to a digital controlled oscillator DCO 2. The DCO is configured to provide an oscillator signal FO in response to the digital frequency control word DFC. The digital loop filter receives a digital phase delay signal DCS from an A/D converter 1B and acts as a low pass filter. The A/D converter is, in this example implemented as a delta-sigma analog-to-digital converter.

A frequency divider 3 is coupled to the output of the DCO and configured to provide a first feedback signal FB and a second feedback signal FBD in response to the oscillator signal FO. The second feedback signal FBD is delayed with respect to the first feedback signal FB. The frequency divider is clocked by the output signal and can thus generate accurate output signals with a resolution of one output cycle of the oscillator signal. In addition to the regular feedback signal FB, the second feedback signal FBD generated can be an exact replica of signal FB but delayed by a number of clock cycles. This delay can be an integer multiple of half clock cycles.

The phase locked loop further comprises a first comparator path 4 and a second comparator path 5. The first comparator path 4 is configured to receive the first feedback signal and the second path 5 is configured to receive the second delayed feedback signal. Each of the first and second comparator paths 4 and 5 are configured to provide a respective phase delay signal CS1, CS2 to the A/D converter 1B. The phase delay signals CS1 and CS2 are generated in response to respective adjustment signals FA1, FA2 and a phase deviation between a common reference signal FR and the respective feedback signal FB and FBD.

For this purpose, each comparator path comprises a phase comparator 42, 52, configured to output a respective control signal PFD1 and PFD2 in response to the phase deviation. The phase comparators are implemented in this example as a phase-frequency-detector (PFD). Coupled to an output of each phase comparator 42, 52 is a charge pump 41, 51, receiving the respective control signal PFD1 and PFD2. The charge pumps 41, 51 are adjustable and configured to provide the respective phase delay signal CS1, CS2 to a combiner element 7 and subsequently to the A/D converter 1B in response to the control signal PFD1, PFD2 and the respective adjustment signal FA1, FA2.

The two comparator paths improve the accuracy of adjusting the output signal phase of the oscillator by interpolating the two feedback signals generated by the frequency divider. In some aspects, a delay between the delayed feedback signal FBD and the feedback signal FB could be one period of the oscillator output signal FO. Such embodiment would provide the lowest current source matching requirements. However, phase comparators and particular PFD's introduce some non-linearity at close to zero input signal time difference. Hence, an increased delay may be more suitable to avoid the non-linear cross-over situation. For example, delaying the feedback signal by two period cycles of the oscillator signal FO gives a 720 degree range, of which 360 degrees is needed. The rest provides overhead to avoid cross-over non-linearity.

The interpolation of the two feedback signals is performed by the charge pumps 41 and 51, respectively. The amplitude of the phase delay signal CS1, CS2 from each charge-pump determines its weight in setting the steady-state output signal phase. For instance, if all amplitude of the combined signal CS is provided by one of the charge-pumps it will alone determine the output phase, and if both charge-pumps have the same amplitude in the combined phase delay signal CS=CS1+CS2, the phase will be half-way between the individual ones. Each charge-pump is controlled by a separate PFD. The net phase delay signal CS will be zero in steady state, i.e. there will be no change over a reference cycle. It is noted that in case of a conventional charge pump, the respective phase delay is a current signal.

Figure 11:
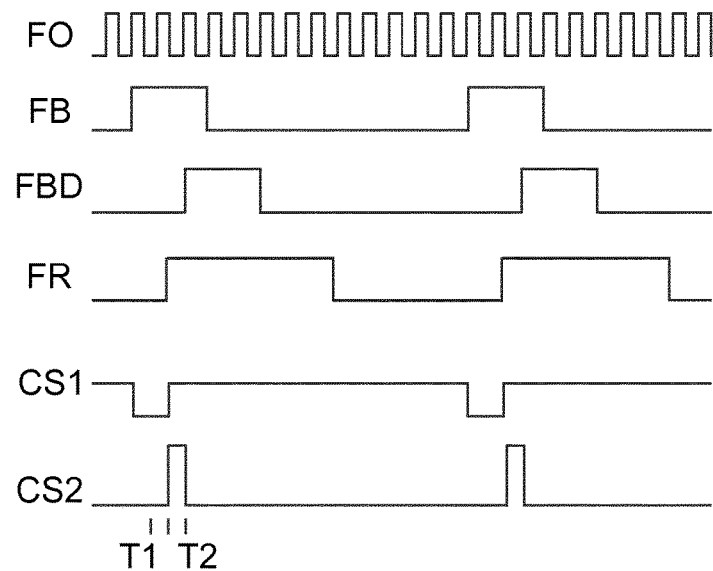
FIG. 11 shows a time diagram for several exemplary signals illustrated in the embodiment of FIG. 1.

FIG. 11 illustrates a non-limiting example of several different signals in accordance with some aspects of the present disclosure. In this example the charge pump phase delay signal provided in the "on" state by charge pump 51 of second comparator path 5 is two times larger than the charge pump phase delay provided by charge pump 41 of the first comparator path. The oscillator output signal FO is applied to the frequency divider, which divides the oscillator signal by a factor 13 (not necessarily maintaining a 50% duty cycle) and outputs the feedback signal FB and a delayed feedback signal FBD. The delayed feedback signal is delayed with respect to the feedback signal FB by two periods of the oscillator output signal FO, or in other words by 720°. The reference signal has its rising edge between a rising edge of the feedback signal FB and a rising edge of the delayed feedback signal FBD. It therefore precedes delayed feedback signal FBD and lags the feedback signal. As a result, during period T1, the first phase comparator 42 provides a phase control signal PFD1 (not shown) to charge pump 41, causing the first charge pump to generate a negative phase delay pulse CS1. During period T2, phase comparator 52 provides a PFD2 signal as to cause charge pump 51 to generate a positive charge pump pulse CS2.

Figure 12:
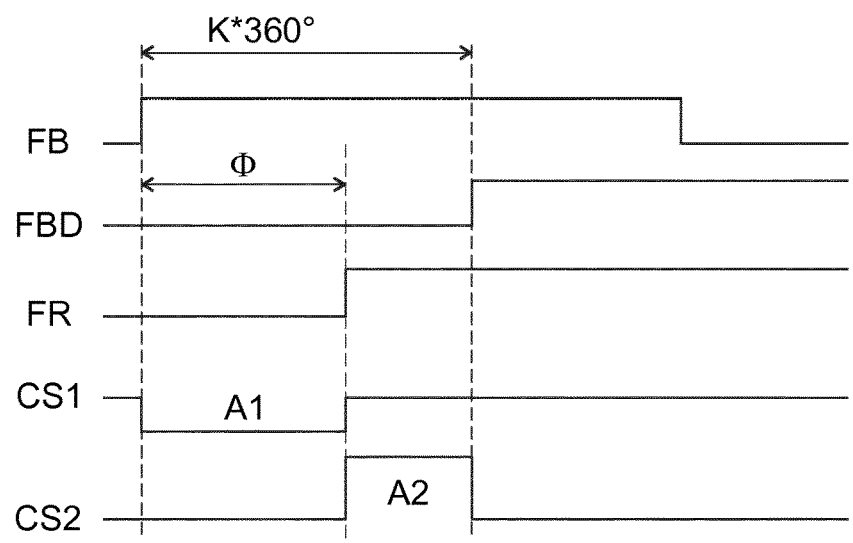
FIG. 12 shows a magnified illustration of the time diagram of FIG. 11.

A close-up of the two charge pump pulses, which in steady-state will have a net area equal to zero, is shown in FIG. 12. Consequently, the oscillator will not change frequency or phase of its output signal. Again delayed feedback signal FBD follows the feedback signal by a fixed delay given by K*360°, wherein K represents half periods of the oscillator's output signal FO. The "delay" between the feedback signal FD and the reference signal FR is set to be the phaseΦ. The area A1 of phase delay signal CS1 equals $\phi^*(-I_{CHP1})$, where $I_{CHP1}$ corresponds to the amplitude of CS1. In case of a conventional charge pump $I_{CHP}$ corresponds to the charge pump current. The area A2 of charge pump pulse 2 equals $(K*360°-\phi)*I_{CHP2}$, where $I_{CHP2}$ corresponds to the amplitude of CS2. Setting the sum of charge pulse areas equal to zero (steady state) gives:

$$|A1| = |A2|$$

$$\phi^*(I_{CHP1}) = (K*360° - \phi)^* I_{CHP2}$$

$$\phi = K \cdot 360° \cdot \frac{I_{CHP2}}{I_{CHP1} + I_{CHP2}}$$

By keeping the sum of charge pump signals $I_{CHP1}+I_{CHP2}$ substantially constant, the phase φ will become proportional to $I_{CHP2}$. The summing or combination of the phase delay signals CS1 and CS2 to provide a combined phase delay signal CS is performed in an optional combiner 7 illustrated in the embodiment of FIG. 1A. Since a constant sum of charge pump phase delay signals $I_{CHP1}+I_{CHP2}$ will provide constant loop dynamics like bandwidth or settling, the phase shift or phase skew can easily be introduced by adjusting charge pump phase delay signal $I_{CHP2}$. A linear phase control can thus be combined with independence of the loop behavior with phase setting.

Due to the interpolation, the frequency division ratio N of the frequency divider is no longer part of the equation above. The phase control is thus independent on N, and N will not affect required matching accuracy in charge pump sources. Even in case of very high N, the matching requirements can be easy to fulfil. Part of the equation is instead K, the number of periods of the oscillator's output signal FO causing the delay of the delayed feedback signal FBD. Note that the oscillator's output signal's frequency might be multiplied with M to get a new frequency. This multiplication of the oscillator's output signal's frequency results in a multiplication of K, i.e. $K_{mult}$=K*M. If K is a larger number the required accuracy in the ratio between $I_{CHP1}$ and $I_{CHP2}$ is increased. On the other hand, if K is chosen to the minimum, i.e. 1 if M=1, the ends of the 360 degree tuning characteristic may be distorted by phase comparator's non-linearity. If M=1 and full 360 degree range with good linearity is needed, K should thus be larger than 1, but not unnecessarily large as that increases matching requirements. For example K can be chosen as 2 as given in the above example. In a similar way if M is equal to 2, K should be at least 0.5 to cover a complete 360 degree range but could be chosen to be 1 to avoid the risk of distortion as mentioned above. Depending on the ratio M, the K value can have different non-integer values and even become smaller than one. That is due to a multiplication of the operative frequency of the phase locked loop, which also increases the phase tuning range by the same multiplication factor.

Figure 1B:
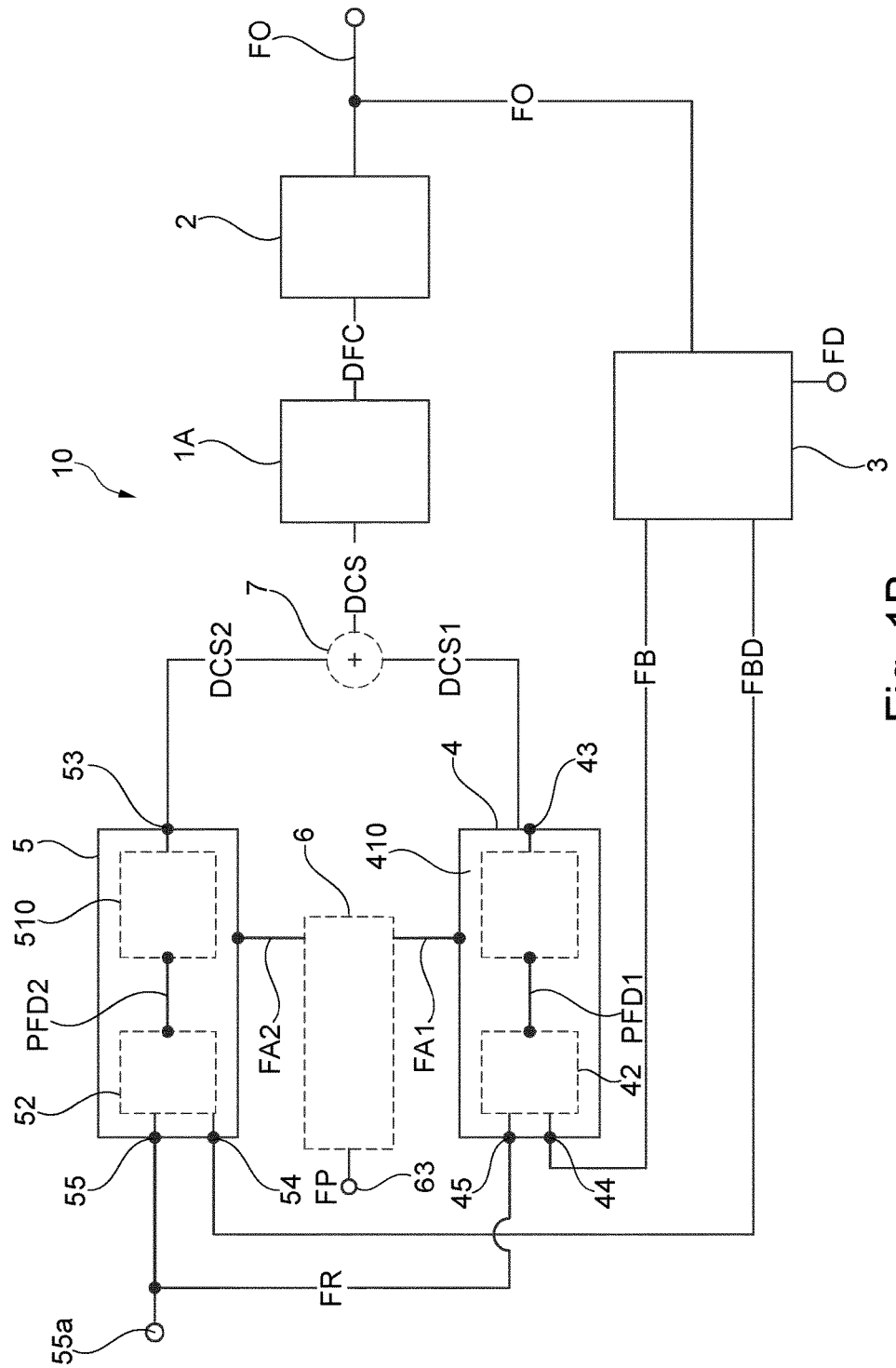
FIG. 1B shows an alternative embodiment of a phase locked loop with a digital controlled oscillator.

In the embodiment of FIG. 1A, the charge pumps provide an analogue phase delay signal, which is converted to a digital word DCS by the A/D converter. The digital combined phase delay signal is applied to the digital loop filter and then to the DCO. An alternative embodiment of a phase locked loop is illustrated in FIG. 1B. In this embodiment, the charge pumps 410 and 510 provide digital phase delay words DCS1 and DCS2, respectively corresponding to the level of deviation detected by the phase-frequency comparators 42 and 52. The digital phase delay words are summed up in combiner 7 in accordance with the disclosure above to provide a combined phase delay word directly to the digital loop filter 1A. The advantage of this solution is a complete digital signal flow between the comparators 42 and 52 and the input of the DCO 2, avoiding the use of analog charge pumps and an ADC as is required in the embodiment of FIG. 1A.

Figure 1C:
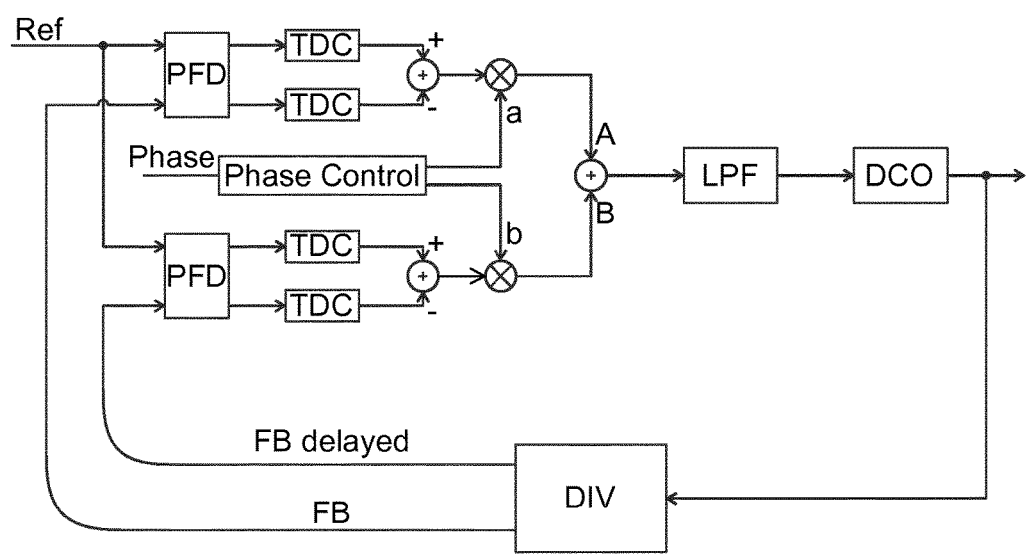
FIG. 1C shows another embodiment illustrating aspects of the present disclosure.

Another embodiment illustrating several aspects of the present disclosure is shown in FIG. 1C. The respective phase detectors PFD, similar to the one from the previous embodiments retrieve the reference signal ref at a first input and the feedback signal and the delay feedback signal, respectively at the other input. Each phase detector outputs respective charge pulses for up and down, respectively as explained further below in the embodiment of FIG. 2. However, instead of combining them to a single phase control output, the pulses are applied to two time-to-digital converters TDC. A time-to-digital converter converts a pulse having a certain pulse width at its input to a digital number corresponding to said width. For instance a TDC with a resolution of 8 bits may convert the pulse width to an 8 bit value up to a maximum pulse width. The maximum pulse width in this case could be set to the period of the reference signal. The resulting phase error between the feedback signal and the reference signal is then calculated by digital subtraction of the width of the charge-up and charge-down pulses. Likewise the phase error between the delayed feedback signal and the reference signal is generated.

Phase control is achieved in a similar way as before. The resulting phase errors in the feedback signal and the delayed feedback signal are multiplied by respective factors a, b provided by the phase control circuit to generate signals A and B, respectively. The multiplication is such that the sum of the "amplitudes" of signals A and B is constant, however in this case the summation is performed with digital representation. Hence, the relation between the parameters a and b is given by $a=1-b$, wherein $0 \leq a \leq 1$ and $0 \leq b \leq 1$. The result of the summation of signals A and B generates the digital input signal to the digital loop filter.

Figure 2:
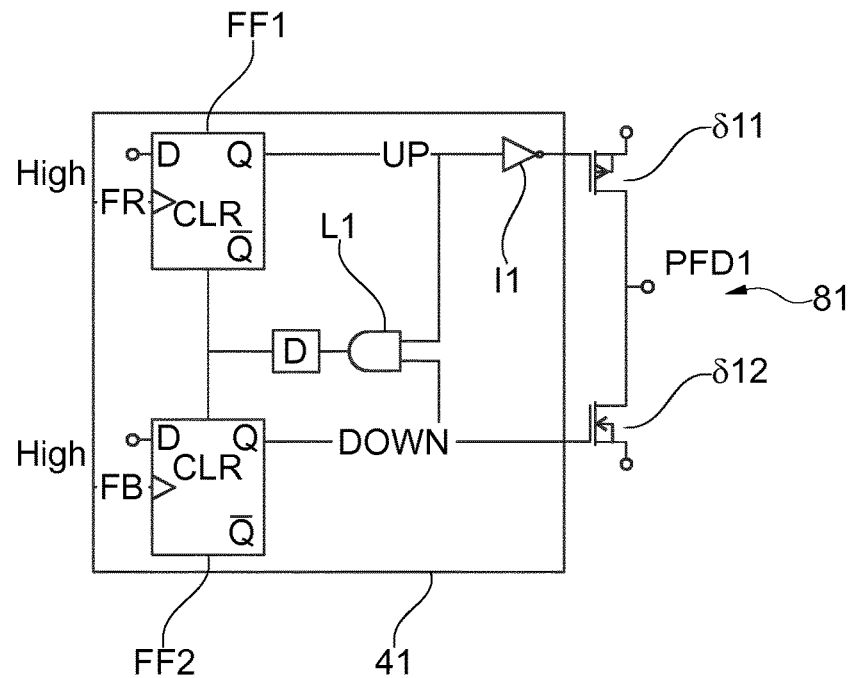
FIG. 2 shows an illustration of a phase detector suitable for an embodiment of the phase locked loop.

An exemplary embodiment of a phase comparator 41 is illustrated in FIG. 2. The phase comparator 52 is of the same type and comprises the same elements. Phase comparator 42 comprises two positive-edge triggered D-Flip-flops FF1 and FF2, wherein their respective signal inputs D are put to HIGH-state. At the clock inputs of each D-Flip-Flop, the reference signal FR and the feedback signal FB, respectively are applied. Data output Q of flip-flop FF1 is connected to inverter 11 and to an input of a logic AND-gate L1. Output of inverter 11 is connected to a gate of switch 811 of a switch 81 of the charge pump arrangement. Output Q of flip-flop FF2 is connected to the other input of logic gate L1 and to gate of switch 812 of the charge pump arrangement. Both switches 811, 812 are coupled to a common output. Output of logic Gate L1 is coupled via delay element D to the reset inputs CLR of the two flip-flops. When both outputs Q are high, gate L1 will disable the FF1 and FF2 after some delay, causing a reset pulse. Without delay element D, the disablement of flip-flops FF1 and FF2 may cause the outputs Q to a high impedance state, stopping the phase comparator from working by producing neither positive nor negative current pulses. In case of phase or frequency deviation between the reference signals and the feedback signal, one of the flip-flops FF1, FF2 produce a respective longer control signal up or down.

Figure 3:
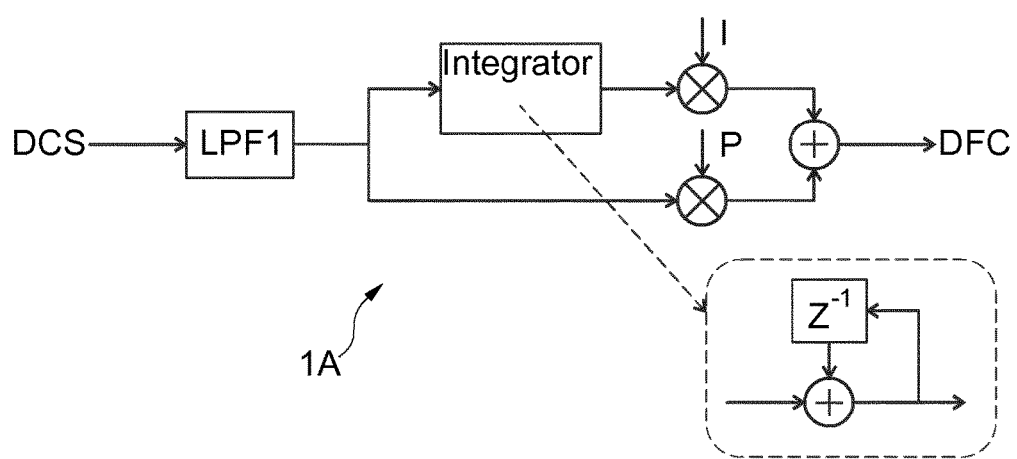
FIG. 3 illustrates an embodiment of a digital programmable loop filter suitable for a phase locked loop of the preceding embodiments.

FIG. 3 illustrates an exemplary embodiment of a programmable digital loop filter 1A. The digital phase delay word DCS is applied at its input to a digital low pass filter LPF1. The output of the digital low pass filter LPF1 is then split up into two paths. The first path includes an integrator, which for example comprises a summing element "+" and a delay element $z^{-1}$ in a feedback loop. The output of the integrator is connected to multiplier to multiply the integrated signal with a factor I and applies the result to a combiner. In the second path the output of digital low pass filter is applied directly to a multiplier for multiplication with a factor P and subsequently to the combiner. The combined digital output signal DFC is then applied to the DCO to adjust the frequency. Parameter I and P as factors for the mixer are used to adjust the bandwidth of the phase locked loop.

Figure 4:
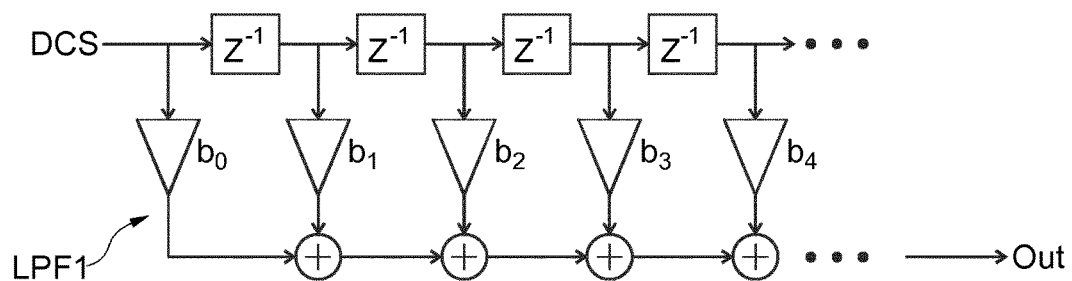
FIG. 4 illustrates another embodiment of a digital loop filter.

The digital low pass filter shown in FIG. 3 can be for example a finite response filter (FIR), or an infinite response filter (IIR). An example of a FIR implementation as a digital low pass filter, which does not need a feedback and is inherently stable is illustrated in FIG. 4. The filter comprises a tapped delay line with a plurality of delay elements $z^{-1}$ connected in series. The outputs of each delay element is connected to an impulse response element $b_0$ to $b_4$ also acting as filter coefficients. The tapped output is then summed up and applied at the output.

Figure 5:
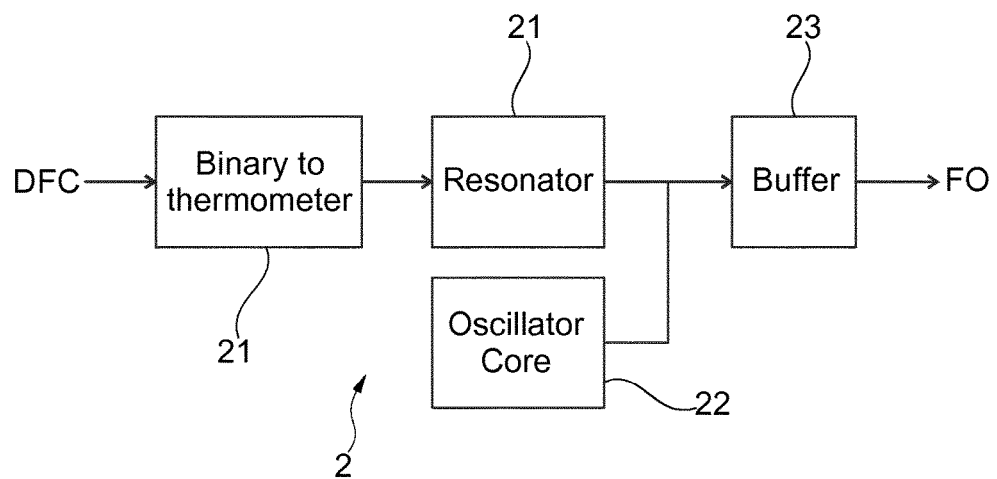
FIG. 5 shows a general embodiment of a digital controlled oscillator.

FIG. 5 shows an illustration of a digital controlled oscillator. The oscillator comprises a binary-to-thermometer decoder 21 performing a decoding of the digital binary coded input signal DFC to an unary coded (thermometer coded) control word. Decoder 21 is connected to the resonator tank 24 of the oscillator, said resonator tank 24 being in operative connection with the oscillator core 22. Resonator tank 24 is used to adjust the output frequency of oscillator core 22. The buffer 23 connected to the output of the oscillator core amplifies the oscillator output signal FO.

Figure 6:
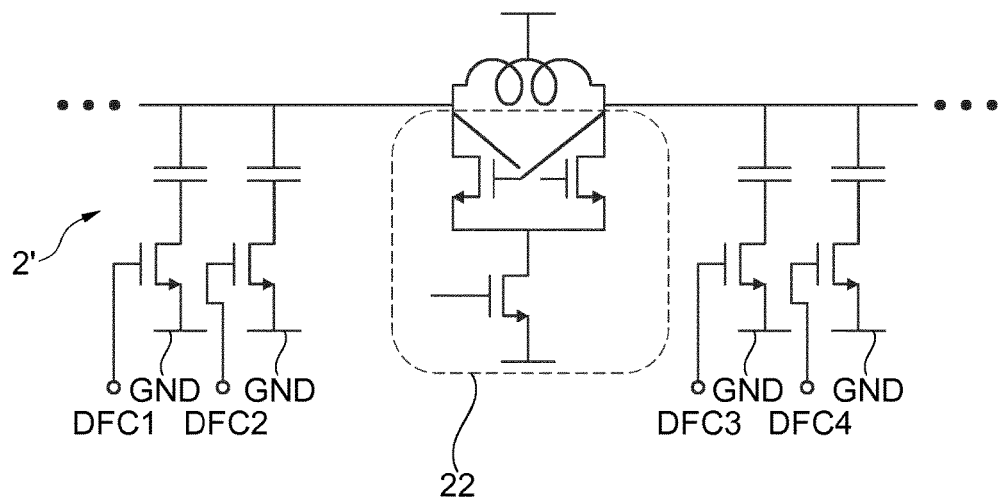
FIG. 6 illustrates another embodiment of a digital controlled oscillator.

FIG. 6 in this regard illustrates a more detailed view of the resonator 21 and the oscillator core 22. Oscillator core 22 comprises a pair of cross coupled negative resistance transistors. A transistor connected between the common node of the switching transistors and ground acts as a current source. Resonator 21 comprises an inductor and a plurality of capacitor cells. Each capacitor cell comprises one capacitor and one transistor. The transistors of the capacitor cells are connected on one end to a respective capacitor and on the other end to the ground potential. Each transistor is switchable by a respective thermometer signal $DFC1_{Therm}$ to $DFC4_{Therm}$. Each capacitor is connected to one of the output taps of the oscillator core 22 in a symmetric fashion. The thermometer encoded digital control word $DFC_{Therm}$ is used in this example to switch the capacitors in pairs in or out of the oscillator circuit, thereby adjusting its resonance frequency. While only 4 capacitors are illustrated herein, the resonator can have a plurality of capacitors. Varactor diodes or other capacitive elements can be used instead of capacitors. Further, the capacitors can have the same capacitance or different, i.e. by a factor of 2 depending on the encoding and/or the applied control words DFC.

Figure 7:
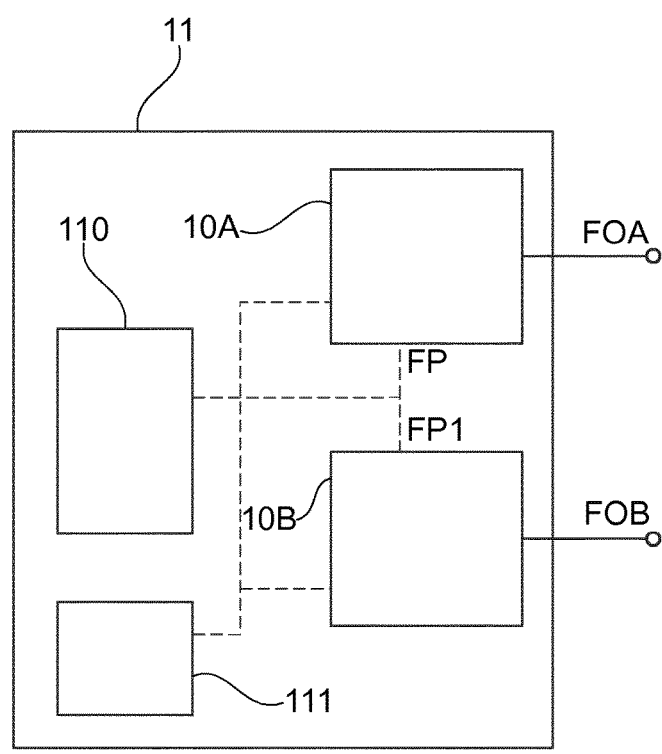
FIG. 7 shows an embodiment of a phase locked loop arrangement particularly for a beamforming system.

The phase locked loop in accordance with several aspects can form a part of a phase locked loop arrangement having more than one phase locked loops. FIG. 7 shows some aspects of such a phase locked loop arrangement 11 for a beamforming system. The arrangement comprises at least two phase locked loops (two of which are shown here) 10A, 10B. The arrangement further comprises a reference signal source 111 providing the reference signal FR. The reference signal source, for example including a temperature stable frequency reference is coupled to the first and second comparator path of each of the phase locked loops 10A and 10B. Further, a phase deviation module 110 is configured to provide a phase control signal FP, FP' to each of the phase locked loops 10A, 10B to generate a phase difference between oscillator signals FOA and FOB of the at least two phase locked loops. The phase control signal FP, FP' can be a digital control word or an analogue signal. The phase control signal FP, FP' is used in the adjustment circuit 6 of the phase locked loop 1 to generate adjustment signal FA1, FA2 adjust the amplitude of phase delay signals CS1, CS2 provided by the charge pumps during the charge pump pulses.

Figure 8:
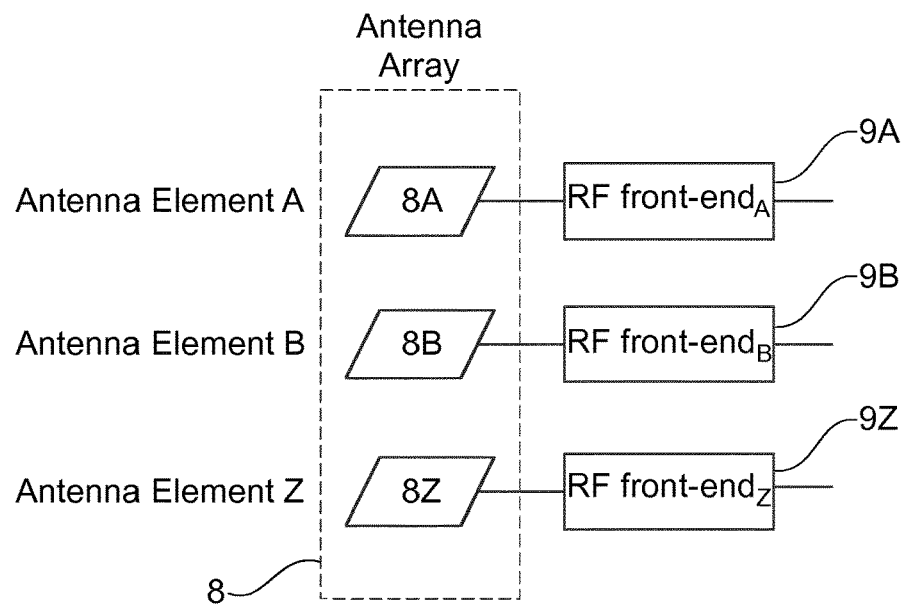
FIG. 8 illustrates a part of a transceiver system in accordance with some aspects of the disclosure.

FIG. 8 illustrates an application of the phase locked loop arrangement in a transceiver device. The term transceiver shall include not only a device able to transmit and receive signals, but also contain a pure transmitter or pure receiver. The transceiver herein is implemented as a beamforming system and comprises an antenna array 8 with a plurality of antenna elements 8A to 8Z. Each of the antenna elements may be located at a different position in space and also point to a different direction. The antenna array may extend over a large area and several elements 8A to 8Z are separated and spaced apart from each other. For example an antenna array may cover an area from a few square centimetres up to several square meters and comprise up to hundreds of individual antenna elements located in that area. In one aspect, the antenna elements are in a fixed position with respect to each other. Each antenna element 8A to 8Z of the antenna array 8 is coupled to a respective RF front-end 9A to 9Z. The RF front-ends are configured to transmit signals to the respective elements, and also receive signals from them. In case of pure transmitter, the RF front-ends are configured only to transmit signals to the respective antenna elements. For pure receiver, the RF front-ends are configured to receive signals therefrom.

In accordance with aspects of the present disclosure, signals transmitted from the RF front-ends comprise—despite being modulated—different dedicated phase skews. These phase skews result in control of the direction of the signals being transmitted over the antenna array 8. This can be used to increase the signal strength in a receiver for demodulation. Likewise, any signal received via the antenna elements 9A to 9Z is processed in the respective RF front-end using phase shifted LO signals. Signals from a specific direction are constructively amplified or combined, while signals from a different direction not corresponding to the respective phase shifted signal are suppressed.

Figure 9:
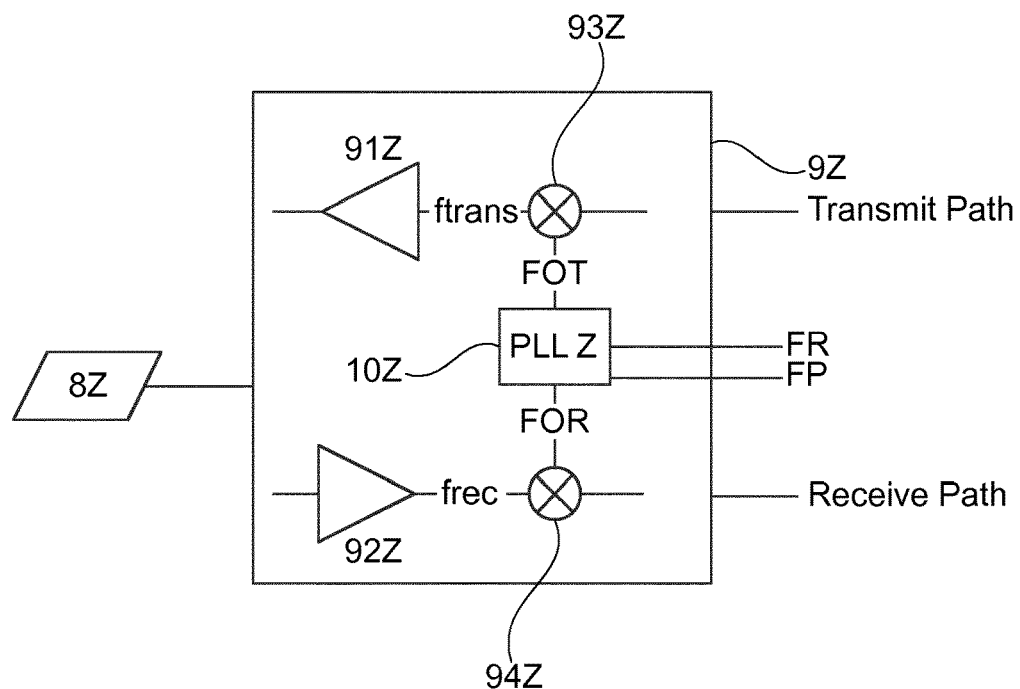
FIG. 9 shows an example of a transceiver element including transmitter and receiver in accordance with some aspect of the present disclosure.

Such processing is further illustrated in FIG. 9 showing an exemplary embodiment of an individual RF front-end 9Z. Each of the RF front-ends is divided into a transmitter path for a transmission signal ftrans and a reception path for processing a received signal frec. Each path comprises an up-mixing module 93Z and down-mixing module 94Z, respectively. The mixing modules are using a local oscillator signal FOT and FOR provided by a phase locked loop module 10Z. Phase locked loop module 10Z can include one or more phase locked loops to generate a local oscillator signal FOT and FOR, respectively. Phase locked loop module 10Z comprises an input for the reference signal FR and for the phase control signal FP.

In the transmission path, mixing module 93Z is used to frequency up-convert or to modulate the data to be transmitted to the transmission signal ftrans. In this regard, the mixing module 93Z can comprise a conventional mixer, a modulator of some sort, i.e. a quadrature modulator, any combination thereof or any other device using the oscillator signal FOT to generate the transmission signal ftrans therefrom. The transmission signal is then amplified using amplifier module 91Z and fed to antenna element 8Z connected thereto. Likewise a received signal frec is amplified using a low-noise amplification module 92Z and then converted to a lower frequency using the oscillator signal FOR. The phase locked loop module 10Z providing the oscillator signals is part of the phase locked loop arrangement as discussed previously. Accordingly, it comprises a frequency and phase adjustment input to adjust the frequency and phase of the oscillator signals FOT and FOR. The phase locked loop module 10Z may in some cases, like in a frequency division duplex (FDD) system, consist of two separate PLLs generating different frequencies for FOT and FOR.

Figure 10:
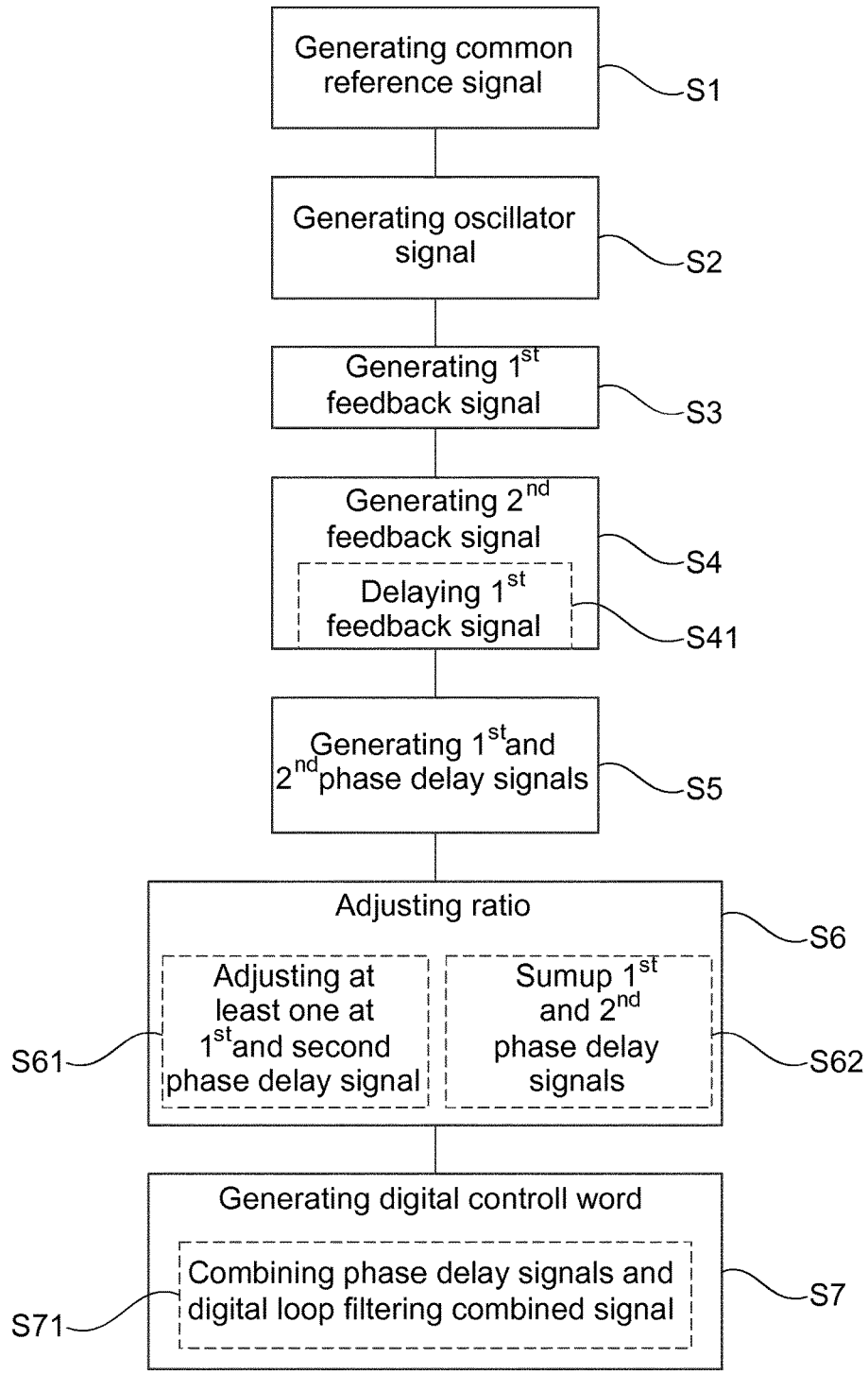
FIG. 10 illustrates aspects of the method for providing an oscillator signal in a phase locked loop.

In yet another aspect, a method for providing an oscillator signal in a phase locked loop is proposed, illustrated in the exemplary method of FIG. 10. The method comprises in its first step S1 to generate a common reference signal FR and in step S2 to generate an oscillator signal (FO) in response to a control signal FC. In a further step S3 a first feedback signal FB based on the oscillator signal FO is generated. Likewise in Step S4, a second feedback signal FBD based on the oscillator signal FO is generated and delayed with respect to the first feedback signal FB.

The generation in steps S3 and S4 can occur at the same time. For example, the oscillator signal is used to simultaneously generate the feedback signals using the same divider ration and also delay one of the feedback signals with respect to the other one. Alternatively as shown in optional step S41, the first feedback signal FB can be generated. Said first feedback signal is then provided further and also delayed by a certain period to generate the second feedback signal. Such delay can be for example achieved by applying the signal to an inverter chain or to clocked gates (e.g. Flip-Flops) in which its propagation is delayed based on a number of periods of the oscillator signal. In an embodiment, the delay is an integer multiple of the half-period of the output signal.

Then in step S5, a first phase delay signal CS1 based on a comparison between the reference signal FR and the first feedback signal FB is generated. Likewise a second phase delay signal CS2 based on a comparison between the reference signal FR and the second feedback signal FBD is generated. These generations may occur simultaneously, while the pulses in the respective phase delay signal CS1 and CS2 may follow one another as shown in the examples of FIGS. 11 and 12. A ratio between the first and second phase delay signals CS1 and CS2 is adjusted in step S6 to control the phase of the oscillator's output signal. Finally, the digital frequency control signal DFC to control the oscillator is generated based on the adjusted ratio of first and second phase delay signals CS1 and CS2. The phase delay signals may be current signals or digital signals.

In step S6 when adjusting the ratio it may be suitable in some aspects, to keep the amplitude of the first and the second phase delay signals CS1 and CS2 substantially constant. In such circumstances, a phase of the oscillator signal FO is adjusted by a portion of the control signal DFC derived from the second phase delay signal CS2 alone. Consequently, as illustrated in step S61 at least one of the first phase delay signal CS1 and second phase delay signal CS2 is adjusted. Adjusting the ratio may also comprise in step S62 summing up the first and second phase delay signals CS1 and CS2.

In an aspect the phase delay signals CS1 and CS2 may be adjusted before they are combined in step S71 into a common phase delay signal CS, from which the digital control word DFC is subsequently derived, for example by converting an analogue phase delay signal CS into a digital word. Alternatively, ratio adjustment is at least partly done when combining the phase delay signals, for example summing up the amplitudes of the first and second phase delay signal is one way of combining these signals.

In the drawings and specification, there have been disclosed exemplary embodiments. However, many variations and modifications can be made to these embodiments.

Accordingly, although specific terms are employed, they are used in a generic and descriptive sense only and not for purposes of limitation, the scope of the embodiments being defined by the following claims. The terms "phase shift" and "phase skew" shall mean the same for the purpose of this disclosure. The terms "phase comparator", "phase detector" and "phase-frequency" detector shall refer to the same element except otherwise stated.

REFERENCE LIST 1A digital loop filter
1B A/D converter
2 digital controlled oscillator
3 frequency divider
4, 5 phase locked loop
6 adjustment circuit
7 combiner element
10, 10A, 10B phase locked loop
41, 51 charge pump
42, 52 phase comparator
43, 53 output
44, 54 feedback input
45, 55, 55a reference input
63 adjustment input
110 phase deviation module
111 reference signal source
410, 510 charge pump
FO oscillator signal
FB feedback signal
FBD delayed feedback signal
CS1, CS2 phase delay signals
CS combined phase delay signal
DCS combined digital phase delay signal
FA1, FA2 phase adjustment signals
DFC digital control word
FR reference signal
FP phase difference signal
FOT LO signal transmission
FOR LO signal reception

The invention claimed is:

1. A phase locked loop for a beamforming system, comprising:
a digital loop filter configured to provide a digital control word to a digital controlled oscillator, said digital controlled oscillator configured to provide an oscillator signal in response to the digital control word;
a frequency divider configured to provide a first feedback signal and a second feedback signal in response to the oscillator signal, the second feedback signal delayed with respect to the first feedback signal;
a first comparator path configured to receive the first feedback signal and a second comparator path configured to receive the second feedback signal, each of the first and second comparator paths configured to provide a respective phase delay signal to the digital loop filter in response to a respective phase adjustment signal and a phase deviation between a common reference signal and the respective feedback signal.

2. The phase locked loop according to claim 1, wherein each of the first and second comparator paths comprises:
a phase comparator configured to output a respective one of the phase control signals in response to the phase deviation;
an adjustable charge pump configured to provide the respective one of the phase delay signals to the digital loop filter in response to the phase control signal and the respective phase adjustment signal.

3. The phase locked loop according to claim 1, wherein the delay of the second feedback signal with respect to the first feedback signal is dependent on the frequency or period of the oscillator signal.

4. The phase locked loop according to claim 3, wherein the delay is an integer multiple of the half-period of the oscillator signal.

5. The phase locked loop according to claim 1, wherein a sum of an amplitude of the respective phase delay signals of the first and second comparator paths is kept substantially constant.

6. The phase locked loop according to claim 1, wherein a phase of the oscillator signal is substantially controlled by the amplitude of the phase delay signal of the second comparator path or by a portion of the digital control word derived from the phase delay signal of the second comparator path.

7. The phase locked loop according to claim 2, further comprising an adjustment circuit configured to adjust a ratio of amplitudes of the phase delay signals of the respective adjustable charge pump.

8. The phase locked loop according to claim 1, further comprising a combiner element for summing the respective phase delay signal from each of the comparator paths and to provide a summed phase delay signal to the digital loop filter.

9. The phase locked loop according to claim 1, wherein the frequency divider is an adjustable divider configured to divide a frequency of the oscillator signal based on a frequency divider word.

10. A phase locked loop arrangement for the beamforming system having at least two phase locked loops according to claim 1 and further comprising:
a reference signal source providing the reference signal and coupled to the first and second comparator paths of each of the at least two phase locked loops;
a phase deviation module configured to provide a phase control signal to each of the phase locked loops to generate a phase difference between oscillator signals of the at least two phase locked loops.

11. Transmitter arrangement, comprising:
the phase locked loop arrangement according to claim 10;
an antenna array having a plurality of antenna elements, wherein each of the antenna elements is in operative connection to a respective one of the phase locked loops of the phase locked loop arrangement to receive an individual signal for transmission derived from the respective oscillator signal thereof.

12. Receiver arrangement, comprising:
the phase locked loop arrangement according to claim 10;
an antenna array having a plurality of antenna elements, wherein each of the antenna elements is in operative connection to a respective one of the phase locked loops of the phase locked loop arrangement to down-convert a received signal with the respective oscillator signal thereof.

13. A method for providing an oscillator signal in a phase locked loop, comprising:
generating a common reference signal;
generating an oscillator signal in response to a digital control word;
generating a first feedback signal based on the oscillator signal and a second feedback signal based on the oscillator signal and delayed with respect to the first feedback signal;

generating a first phase delay signal based on a comparison between the reference signal and the first feedback signal and a second phase delay signal based on a comparison between the reference signal and the second feedback signal;
adjusting a ratio between the first and second phase delay signals;
generating the digital control word based on the adjusted phase delay ratio of first and second phase delay signals.

14. The method according to claim 13, wherein generating the second feedback signal comprises delaying the first feedback signal depending on the frequency or period of the oscillator signal.

15. The method according to claim 14, wherein the delay is an integer multiple of a half-period of the output signal.

16. The method according to claim 13, wherein a sum of the first and the second phase delay signals is kept substantially constant.

17. The method according to claim 13, wherein a phase of the oscillator signal is adjusted by a portion of the digital control word derived from the second phase delay signal.

18. The method according to claim 13, wherein adjusting the ratio comprises adjusting a respective amplitude of at least one of the first and second current signals.

19. The method according to claim 13, wherein generating the digital control word comprises combining the first and second phase delay signals and filtering the combined phase delay signals.

* * * * *